United States Patent [19]

Galani et al.

[11] Patent Number: 4,882,549

[45] Date of Patent: Nov. 21, 1989

[54] CENTER OFFSET MICROWAVE FREQUENCY SYNTHESIZER

[76] Inventors: Zvi Galani, 3 Birchwood Dr., Bedford, Mass. 01730; Malcolm E. Skinner, 67 Walnut Ave., Andover, Mass. 01810; John A. Chiesa, 34 Locust St., Dracut, Mass. 01826

[21] Appl. No.: 272,044

[22] Filed: Nov. 16, 1988

[51] Int. Cl.$^4$ .............................................. H03L 7/18
[52] U.S. Cl. ......................................... 331/14; 331/16; 331/17; 331/30
[58] Field of Search ...................... 331/1 A, 14, 16, 17, 331/25, 30

[56] References Cited

U.S. PATENT DOCUMENTS 3,023,370  2/1962  Waller ................................. 331/14 X
3,793,594  2/1974  Griswold ............................ 331/14 X Primary Examiner—Siegfried H. Grimm Attorney, Agent, or Firm—Philip J. McFarland; Richard M. Sharkansky

[57] ABSTRACT

An improved microwave frequency signal source using a single frequency offset technique which increases the frequency range of an indirect frequency synthesizer to twice the highest operating frequency of the programmable digital frequency divider in the loop includes a voltage-controlled oscillator (VCO) operating within a predetermined microwave frequency band and phase-locked to a reference oscillator operating at a reference frequency below microwave frequencies. The offset loop signal is developed by heterodyning the voltage-controlled oscillator (VCO) output signal with a microwave signal whose frequency is located at the center of the predetermined microwave frequency band of the VCO to form a signal at an intermediate frequency (I.F.) within the frequency range of a programmable digital frequency divider.

4 Claims, 2 Drawing Sheets

CENTER OFFSET MICROWAVE FREQUENCY SYNTHESIZER

BACKGROUND OF THE INVENTION

This invention pertains generally to microwave signal sources, and more particularly to a microwave signal source comprising a digital frequency synthesizer using a single frequency offset technique with the frequency range of the signal source operating up to twice the highest operating frequency of a digital frequency divider in a phase-locked loop.

As is known in the art, microwave signal sources are a necessary element of communication and radar systems. Digital frequency synthesizers offer an attractive approach to generation of microwave multifrequency signals in applications not requiring continuous tuning capability. Digital frequency synthesizer architectures fall into two general categories. The first, known as direct frequency synthesizer architecture, is open-loop and utilizes frequency multipliers, dividers and mixers as key components. An advantage of such architecture is an extremely short frequency switching time. However, any known direct frequency synthesizer architecture generates more spurious frequencies and has more elements than the second category known as "indirect frequency synthesizer architecture."

Indirect frequency synthesizer architecture consists of digital phase-locked loops where the frequency of a voltage-controlled oscillator (VCO) is selected by the frequency division ratio of a programmable digital frequency divider (hereinafter also referred to as a "digital divider"). In applications where the frequency of the VCO output signal exceeds the highest frequency capability of the digital divider, the VCO output signal is heterodyned to a signal of suitable selected lower frequency for use in a phase-locked loop, known as an "offset loop." An advantage of known indirect frequency synthesizer architecture is that lower spurious levels are experienced due to the low-pass filter characteristics of phase-locked loops. A disadvantage of known indirect frequency synthesizer architecture is that a relatively long frequency switching time is realized because of the characteristics of known phase-locked loops. A further disadvantage of the indirect frequency synthesizer architecture using offset loops is that the frequency range of the output signal of the VCO is limited to the frequency range of the digital divider.

A conventional indirect frequency synthesizer employing a digital phase-lock loop consists essentially of a voltage-controlled oscillator (VCO) output signal phase-locked to a reference oscillator signal in a single offset digital phase-lock loop. A signal from an offset generator is used to heterodyne the full frequency range of the VCO output signal to lower intermediate frequencies (I.F.) within the frequency limits of the programmable digital frequency divider. The frequency of the offset generator signal is either slightly below the lowest frequency of the synthesizer output signal or slightly above the highest frequency of the synthesizer output signal in order to produce I.F. signals over the full frequency range of the synthesizer. The frequency of the VCO output signal is determined by the division ratio of the digital divider, such ratio being set by a suitable digital word applied to a decoder. The output signal of the digital divider and a reference frequency signal are connected to the two input ports of a digital phase/frequency detector, the output signal of which is amplified in a loop amplifier, filtered by a loop filter and applied to the tuning port of the VCO. The digital word that commands a specific VCO frequency sets the frequency division ratio of the digital divider to a value that, for the specific VCO frequency, produces a signal with a frequency equal to the frequency of the reference signal at the output of the digital divider. Following the application of a frequency select command, the frequency division ratio of the digital divider changes, causing the loop to unlock. Under such conditions the phase/frequency detector acts as a discriminator and generates a voltage that, following amplification and filtering, tunes the frequency of the VCO into a capture range of the loop. When the capture range is reached, the phase/frequency detector takes on the characteristics of a phase detector and generates an error voltage required for phase-lock. Such a frequency synthesizer can generate signals of equally-spaced frequencies, with the smallest spacing increment equal to the reference frequency.

The frequency range that the frequency synthesizer can generate is limited by the highest operating frequency of the programmable digital frequency divider. In applications where wider frequency ranges have to be generated this limitation is usually overcome by either using multiple frequency offset generators or by adding a higher frequency fixed digital divider (prescaler) before the programmable digital frequency divider.

The disadvantage of the multiple frequency offset generator is in its added level of complexity because the frequency range of the synthesizer signal has to be partitioned into bands equal to the maximum operating frequency range of the digital divider signal, and one offset frequency has to be synthesized for every band.

The addition of a prescaler before the digital divider introduces several disadvantages. If the frequency division ratio of the prescaler is K, then the total frequency division ratio is increased by by the factor K. In a second order loop (typically used in this type of application) a K-fold increase in the frequency division ratio reduces the highest realizable loop bandwidth by the factor $\sqrt{K}$ and reduces the highest realizable open-loop gain by the factor K (20 log K dB). The reduced open loop gain magnitude causes a commensurate reduction in the capability of the loop to degenerate FM noise. A reduction in the realizable loop bandwidth also increases the switching time when frequency is to be changed. Also, if the frequency division ratio of the prescaler is K, then the frequency of the reference oscillator signal also has to be reduced by the factor K so that the phase/frequency detector can operate with the same frequency signals at its two input ports. It is therefore desirable to increase the frequency range of the VCO output signal without increasing the frequency division ratio of the loop.

SUMMARY OF THE INVENTION

With the foregoing background of the invention in mind, it is a primary object of this invention to provide a microwave frequency signal source using a single frequency offset technique to increase the frequency range of an indirect frequency synthesizer to twice the highest operating frequency of a programmable digital frequency divider in the loop without increasing the frequency division ratio of the loop.

It is another object of this invention to increase the frequency range of an indirect frequency synthesizer without reducing the highest realizable loop bandwidth.

It is another object of this invention to increase the frequency range of an indirect frequency synthesizer without reducing the maximum realizable open loop gain and the FM noise degeneration capability of the loop.

The foregoing and other objects of this invention are generally attained by providing a microwave frequency signal source using a single frequency offset technique wherein a voltage-controlled oscillator operating within a predetermined band of microwave frequencies is phase-locked, using a phase/frequency detector, to a reference oscillator operating at a reference frequency below microwave frequencies. An I.F. (intermediate frequency) signal is developed by heterodyning the output signal of the voltage-controlled oscillator with a siqnal from the output of an offset generator whose frequency is located approximately at the center of the predetermined microwave frequency band. The frequency of the output signal of the offset mixer used to heterodyne the signals out of the VCO and the offset generator is within the frequency range of a programmable digital frequency divider. Such divider is capable of dividing the input frequency by a predetermined division ratio to produce an offset loop signal required for the phase/frequency detector to phase-lock the VCO output signal to the reference signal provided by the reference oscillator. The change of the VCO frequency as related to the change of the I.F. frequency for VCO frequencies below the offset frequency creates a relationship which is opposite to the relationship created when the VCO frequencies are above the offset frequency. For VCO frequencies below the offset frequency, the I.F. frequency decreases with increasing VCO frequency and for VCO frequencies above the offset frequency, the I.F. frequency increases with increasing VCO frequency. Since a phase-lock loop cannot be stable with both of these relationships, a switching means is used to switch the polarity of the output signal of the phase/frequency detector to accomplish each of the relationships. An initialization circuit ensures that when a frequency is selected above the offset frequency the frequency of the VCO output signal frequency is above the offset frequency and when a frequency is selected below the offset frequency the frequency of the VCO output signal is below the offset frequency.

BRIEF DESCRIPTION OF THE DRAWINGS

The foregoing features of this invention, as well as the invention itself, may be more fully understood from the following detailed description read together with the accompanying drawings, wherein.

DESCRIPTION OF THE PREFERRED EMBODIMENT

Figure 1:
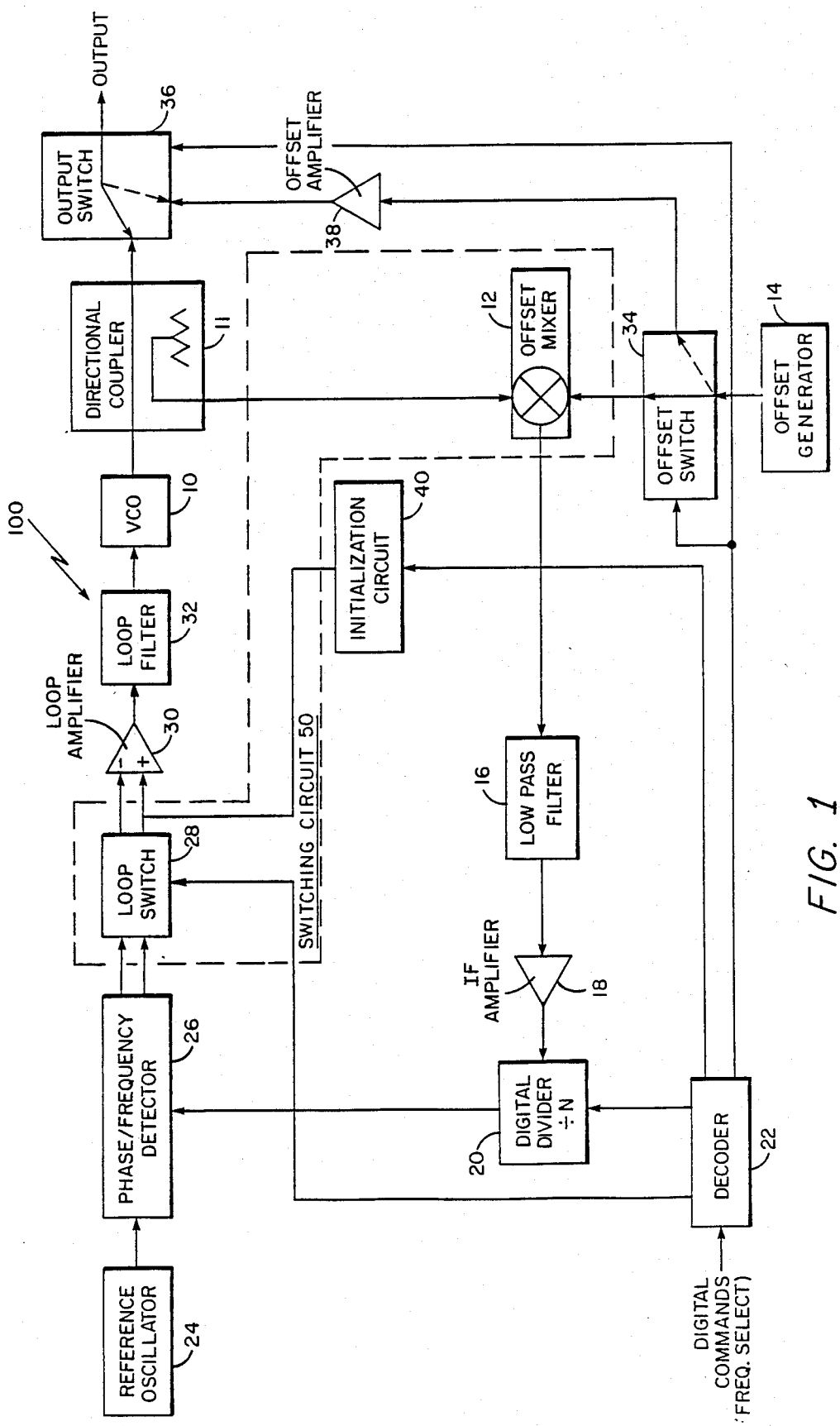
FIG. 1 is a simplified block diagram of a microwave frequency signal source according to this invention.

Referring now to FIG. 1, a microwave frequency signal source 100 is shown to include a microwave, say an X-band, voltage-controlled oscillator (VCO 10). The output signal from VCO 10 is shown to be coupled, via a directional coupler 11, to an offset mixer 12. An offset generator 14, here a crystal-controlled oscillator followed by a frequency multiplier capable of producing a microwave frequency signal approximately at the center of the desired microwave frequency band, is connected via offset switch 34 to the offset mixer 12 which is capable of heterodyning the output signal of VCO 10 and the output signal of offset generator 14 to produce an intermediate frequency (I.F.) signal within the input frequency range of a programmable digital frequency divider (digital divider 20). The I.F. signal passes through low pass filter 16 which allows the desired band of frequencies to pass through an I.F. amplifier 18 to raise the signal level to accommodate the input of digital divider 20. Such divider is capable of dividing the frequency of the signal out of the I.F. amplifier 18 by a predetermined division ratio (N) as commanded by a decoder 22. Decoder 22 provides control signals, as required in response to a suitable digital word which correlates to a specific microwave frequency of the output signal. Digital divider 20 is constructed in accordance with known art so as to be capable of dividing the frequency of the I.F. signal by N, thereby producing an output signal of the same frequency as the reference oscillator 24. The output signal of the digital frequency divider 20 is applied to an input of phase/frequency detector 26.

Digressing briefly here now for a moment, it will be noted by those of skill in the art that this introduces an ambiguity because every I.F. frequency has two corresponding VCO frequencies. This ambiguity can be eliminated by the addition of a VCO frequency initialization circuit 40. When a frequency select command is applied to the decoder 22, a signal from the decoder 22 causes the initialization circuit 40 to apply an appropriate D.C. voltage signal to loop amplifier 30. If the selected frequency is below the offset frequency, the initialization circuit 40 positions the frequency of the VCO output signal below the frequency of the offset generator. If the selected frequency is above the offset frequency, the initialization circuit 40 positions the frequency of the VCO output signal above the frequency of the offset generator. This technique eliminates frequency ambiguity because the selected frequency and an initialization frequency are always on the same side of the offset frequency.

It will also be appreciated by those of skill in the art that for each intermediate frequency two relationships exist between the VCO frequency and the I.F. frequency. For VCO frequencies below the offset frequency the I.F. frequency decreases with increasing VCO frequency; for VCO frequencies above the offset frequency the I.F. frequency increases with increasing VCO frequency. If the loop (not numbered) is configured to exhibit negative feedback (stability) when the VCO frequency is greater than the offset frequency, then the loop (not numbered) exhibits positive feedback when the VCO frequency is less than the offset frequency. To correct for the latter condition negative feedback is restored by switching (interchanging) the two outputs of the phase/frequency detector 26 which reverses the polarity of an output signal (error voltage) of a loop amplifier 30.

The phase/frequency detector 26 has two inputs. The first input is from a reference oscillator 24, here a crystal-controlled oscillator operating at 10 MHz, which is capable of producing a reference frequency signal. The second input is from the digital divider 20. Following frequency initialization the phase/frequency detector 26 acts as a discriminator and develops an output signal that changes the frequency of the VCO output signal from an initialization frequency to a capture range of the loop about the selected frequency. When the capture range is reached, the phase/frequency detector 26 takes on the characteristics of a phase detector and generates a control signal required for phase-lock. The output of phase/frequency detector 26 is connected via loop switch 28 to loop amplifier 30 which increases the signal level and passes through loop filter 32 before being applied to a tuning control input of VCO 10.

When the selected frequency is above the offset frequency, the I.F. frequency increases with increasing VCO frequency and when the selected frequency is below the offset frequency the I.F. frequency decreases with increasing VCO frequency. When a frequency is selected above the offset frequency, decoder 22 sends a control signal to loop switch 28 which causes loop switch 28 to connect the output signal of phase/frequency detector 26 to loop amplifier 30 such that an increase in the I.F. frequency causes an increase in the frequency of the VCO 10 output signal. When the selected frequency is below the offset frequency, decoder 22 sends a control signal to loop switch 28 which causes loop switch 28 to connect the output signal of phase/frequency detector 26 to loop amplifier 30 such that an increase in the I.F. frequency causes the frequency of the VCO 10 output signal to decrease.

It will be appreciated by those of skill in the art that by using an offset frequency in the center of the desired band the VCO 10 cannot generate a signal with a frequency equal to the offset frequency. This can be solved by using the output signal of offset generator 14 as the output signal of microwave frequency signal source 100. The output signal of offset generator 14 is switched, via offset switch 34, to either an input of offset mixer 12 or to the input of offset amplifier 38 as commanded by decoder 22. When the selected frequency is not the offset frequency, offset switch 34 is in position to connect the output signal of offset generator 14 to an input of offset mixer 12. When the selected frequency is equal to the offset frequency a control signal from decoder 22 places offset switch 34 in position to connect the output signal of offset generator 14 to the input of offset amplifier 38. Offset amplifier 38 is capable of amplifying the output signal of offset generator 14 to a level equal to the level of the VCO 10 output signal so the next stage (not shown) will receive the same signal level when selected. Output switch 36, also commanded from decoder 22, places either the VCO 10 output signal or the output signal of offset amplifier 38 at the output of the microwave frequency signal source 100.

Figure 2:
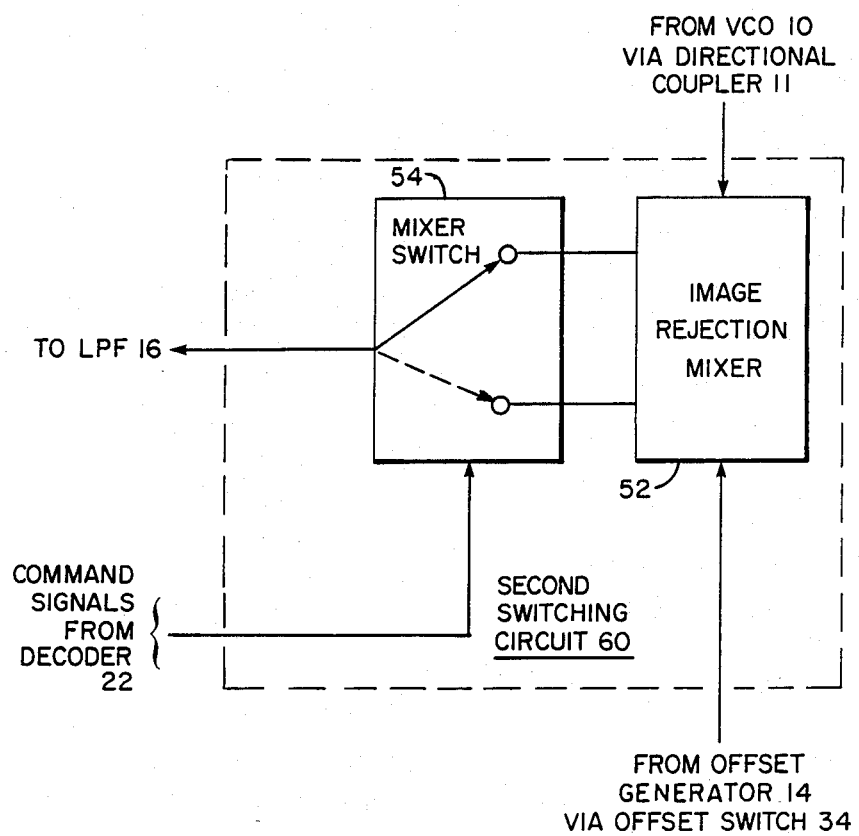
FIG. 2 is a simplified block diagram of an alternative embodiment of a microwave frequency signal source according to this invention.

Referring now to FIGS. 1 and 2, a second embodiment according to the invention is shown wherein like references indicate like parts as described in the first embodiment but where switching circuit 50 is replaced by second switching circuit 60. The output signal from VCO 10 is coupled, via directional coupler 11, to image rejection mixer 52. Offset generator 14 is connected to image rejection mixer 52 via offset switch 34. The operation of the image rejection mixer 52 is such that any signal out of the VCO with a frequency above the offset frequency produces an I.F. signal directed to a first output port (not numbered) while any signal out of the VCO with a frequency below the offset frequency produces an I.F. signal directed to a second output port. Mixer switch 54, commanded by decoder 22, selects one of the two outputs of image rejection mixer 52, depending on whether the selected frequency is below or above the offset frequency and connects the signal to the input of low pass filter 16. If the selected frequency is above the offset frequency then mixer switch 54 selects an output of image rejection mixer 52 such that an increase of the I.F. frequency causes an increase of the frequency of the VCO output signal. If the selected frequency is below the offset frequency then mixer switch 54 selects the other output of image rejection mixer 52 such that an increase of the I.F. frequency causes a decrease of the frequency of the VCO output signal. In this second embodiment loop switch 28 is not used; therefore, the output signal of phase/frequency detector 26 is fed directly into the input of loop amplifier 30.

As previously explained, to ensure the selected frequency and the initialization frequency are on the same side of the offset frequency, initialization circuit 40, commanded by decoder 22, provides a control D.C. voltage to loop amplifier 30 to drive the frequency of the VCO output signal above or below the offset frequency, depending on the frequency selected. As an alternative embodiment, VCO 10 could have a coarse tune input as a second input and an alternative initialization circuit (not shown) could be used to provide a control signal to VCO 10 to ensure the frequency of the VCO 10 output signal is on the correct side of the offset frequency at initialization. As in the first embodiment, offset switch 34, offset amplifier 38 and output switch 36 are capable of switching the output of the offset generator 14 to the output of the microwave frequency signal source 100 when the frequency selected is equal to the offset frequency. Otherwise, offset switch 34 places the output signal from offset generator 14 at an input of image rejection mixer 52 and output switch 36 places the output of VCO 10 at the output of microwave frequency signal source 100.

Having described a preferred embodiment of this invention, it will now be apparent to one of skill in the art that many changes may be made without departing from our inventive concepts. For example, the frequencies at which the oscillators operate and the band of microwave frequencies over which the VCO is operative as described may be changed as required. It is felt, therefore, that this invention should not be restricted to its disclosed embodiment, but rather should be limited only by the spirit and scope of the appended claims.

What is claimed is:

1. In the operation of an improved microwave frequency signal source using an indirect frequency synthesizer architecture including a voltage-controlled oscillator (VCO), responsive to a control signal having either one of two polarities which produces a microwave frequency output signal within a predetermined band of microwave frequencies, the method comprising the steps of:

(a) producing an offset frequency signal having a frequency approximately at the middle of a predetermined band of microwave frequencies and heterodyning the offset frequency signal with the output signal of the VCO, thereby forming an intermediate frequency (I.F.) signal having a frequency indicative of the magnitude of the difference between the frequency of the offset frequency signal and the output signal of the VCO;

(b) dividing the I.F. signal by a predetermined division ratio producing a frequency divider output signal having a frequency lower than the frequency of the I.F. signal;

(c) forming a first portion of the control signal with an amplitude in accordance with the frequency divider output signal; and (d) changing the polarity of the first portion of the control signal in accordance with the frequency of the output signal of the VCO relative to the frequency of the offset frequency signal to produce the control signal to be applied to the VCO.

2. An improved microwave frequency signal source, such source comprising:

(a) a first, second and third oscillating means where the first oscillating means is a voltagecontrolled oscillator (VCO) for producing a microwave frequency signal anywhere within a predetermined band of such signals in response to an applied control signal having either one of two polarities, where the second oscillating means is an offset generator capable of producing a microwave frequency signal about the middle of the predetermined band, and where the third oscillating means is a crystal-controlled oscillator capable of producing a reference signal of frequency lower than the frequency of microwave signals;

(b) mixing means, responsive to the output signals of the first and second oscillating means, for producing an intermediate frequency signal;

(c) dividing means, responsive to the intermediate frequency signal out of the mixing means for dividing the frequency of such signal by a predetermined division ratio to produce an output signal at a frequency approximating the frequency of the signal produced by the third oscillating means, the predetermined division ratio being commanded in response to a digital word indicative of a specific microwave frequency of for the output signal of the microwave frequency signal source;

(d) detection means, responsive to the signal produced by the third oscillating means and the output signal of the dividing means, for producing the control signal to control the frequency of the first oscillating means output signal; and (e) first switching means, actuable in accordance with whether the frequency of the first oscillating means is selected to be above or below the frequency of the second oscillating means, for changing the polarity of the control signal, whereby the frequency of the first oscillating means is changed until the control signal is nulled.

3. A microwave frequency signal source as in claim 2 wherein:

(a) the first switching means comprises a switch responsive to a second control signal that controls the polarity of the control signal out of the detection means;

(b) second switching means comprising: initialization means responsive to a third control signal capable of driving the frequency of the VCO output signal either above or below the frequency of the output signal of the offset generator; and (c) third switching means comprising: output means responsive to a fourth control signal that switches, selectively, the output signal of the offset generator or the output signal of the VCO to the output of the microwave frequency signal source.

4. A microwave frequency signal source as in claim 2 wherein the mixing means comprises:

(a) an image rejection mixer capable of heterodyning the output signal of the offset generator with the output signal of the voltage-controlled oscillator to produce two intermediate frequency control signals such that VCO output signals with a frequency above the offset frequency produce an I.F. signal directed to a first output port while VCO output signals with a frequency below the offset frequency produce an I.F. signal directed to a second output port; (b) first switching means comprising a switch responsive to a second control signal capable of selecting one of the two intermediate frequency control signals; (c) second switching means comprising: initialization means responsive to a third control signal capable of driving the frequency of the VCO output signal either above or below the frequency of the offset generator; and (d) third switching means comprising: output means responsive to a fourth control signal that switches, selectively, the output signal of the offset generator or the output signal of the VCO to the output of the microwave frequency signal source.

* * * * *

UNITED STATES PATENT AND TRADEMARK OFFICE
CERTIFICATE OF CORRECTION

PATENT NO. : 4,882,549
DATED : November 21, 1989
INVENTOR(S) : Zvi Galani, et. al.

It is certified that error appears in the above-identified patent and that said Letters Patent is hereby corrected as shown below:

On the Cover Sheet, please add the following:

-- Assignee: Raytheon Company, Lexington, Mass.--

Signed and Sealed this

Sixth Day of November, 1990

Attest:

HARRY F. MANBECK, JR.

*Attesting Officer*      *Commissioner of Patents and Trademarks*